(12) United States Patent
Pan et al.

(10) Patent No.: US 6,205,056 B1
(45) Date of Patent: Mar. 20, 2001

(54) AUTOMATED REFERENCE CELL TRIMMING VERIFY

(75) Inventors: Feng Pan, San Jose; Colin S. Bill, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/524,897

(22) Filed: Mar. 14, 2000

(51) Int. Cl.[7] ................................................ G11C 16/06
(52) U.S. Cl. ................................... 365/185.2; 365/185.22
(58) Field of Search ........................... 365/185.2, 185.21, 365/185.22, 185.24, 185.19

(56) References Cited

U.S. PATENT DOCUMENTS

| | | | |
|---|---|---|---|
| 5,163,021 | * 11/1992 | Mehrotra | 365/201 |
| 5,444,656 | * 8/1995 | Bauer | 365/189.01 |
| 5,822,250 | * 10/1998 | Krzentz | 365/185.21 |

* cited by examiner

Primary Examiner—Amir Zarabian
(74) Attorney, Agent, or Firm—Davis Chin

(57) ABSTRACT

A reference trimming verify circuit and method is provided for performing a program verify operation on a reference cell transistor in an array of Flash EEPROM memory cells. A reference current branch is used to generate a reference current corresponding to a predetermined overdrive voltage of the reference cell to be programmed. A drain current branch is coupled to the reference cell transistor to be programmed and generates a drain current at a fixed gate voltage applied to its control gate and at a predetermined drain voltage applied to its drain when the drain current is at the desired level. A comparator is used to compare a sensed voltage corresponding to the drain current and a reference voltage corresponding to the reference current. The comparator generates an output signal which is at a low logic level when the sensed voltage is less than the reference voltage and which is at a high logic level when the sensed voltage is greater than the reference voltage. A program pulse is applied to the reference transistor each time the comparator generates the low logic level and terminates the program pulse when the comparator generates the high logic level.

10 Claims, 1 Drawing Sheet

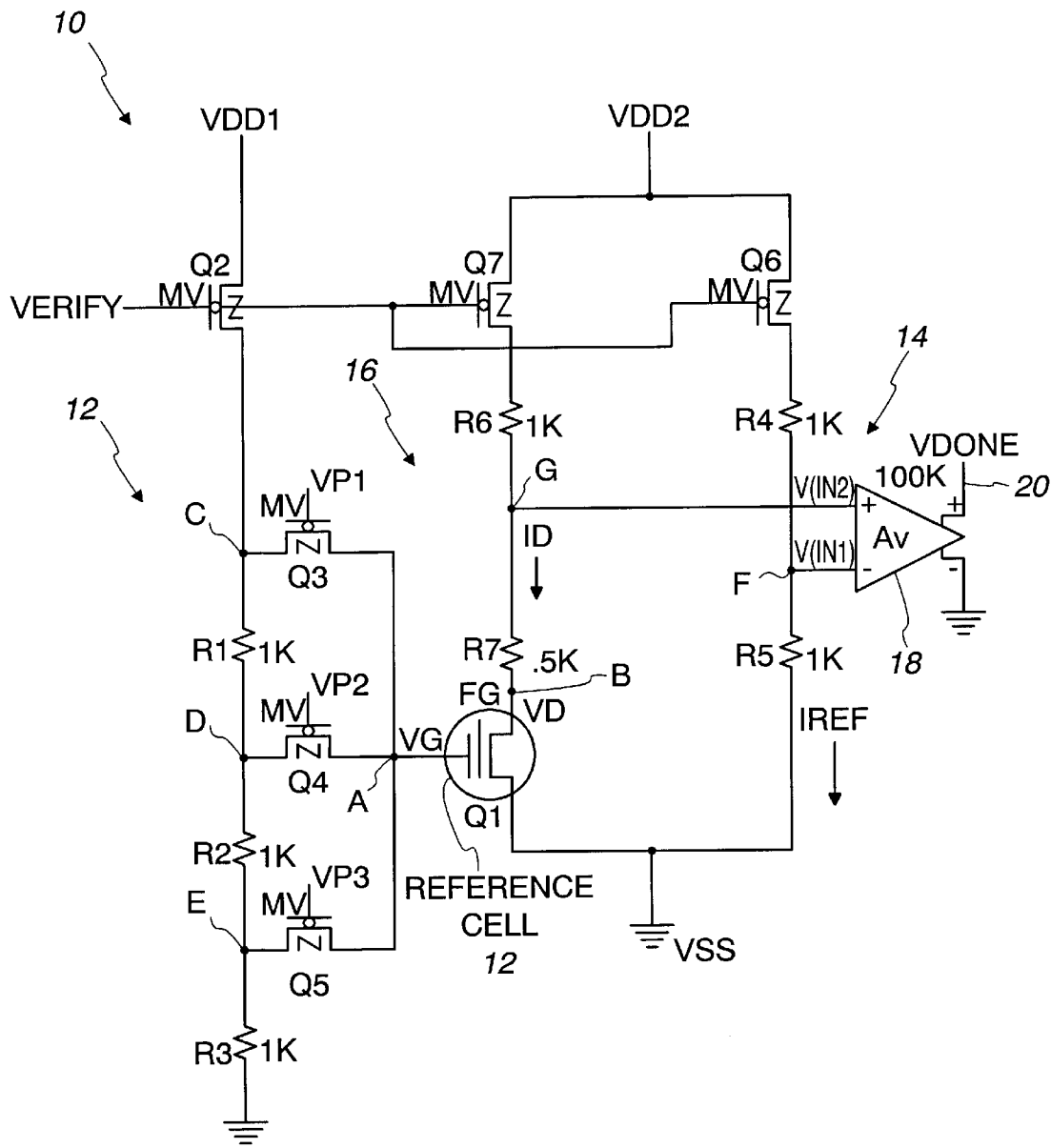

AUTOMATED REFERENCE CELL TRIMMING VERIFY

BACKGROUND OF THE INVENTION

This invention relates generally to floating gate memory devices such as an array of Flash electrically, erasable programmable read-only memory (EEPROM) cells. More particularly, it relates to a reference cell trimming verify circuit and method for use in an array of Flash EEPROM memory cells for performing a program verify operation on a reference cell so as to reduce overall testing time during a production process.

As is generally well known in the art, electrical programmable and erasable memory array devices using a floating gate for the storage of charges thereon (Flash EPROMs/EEPROMs) have emerged in recent years. In a conventional EEPROM memory device, a plurality of one-transistor memory cells may be formed on a semiconductor substrate in which each cell is comprised of a P-type conductivity substrate, an N-type conductivity source region formed integrally within the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

In order to program the EEPROM cell, the drain region and the control gate are raised to predetermined potentials above the potential applied to the source region. For example, the drain region has applied thereto a voltage of approximately +5.0 volts with the control gate having a voltage of approximately +8.5 volts applied. These voltages produce "hot electrons" which are accelerated across the thin dielectric layer and onto the floating gate. This hot electron injection results in an increase of the threshold of the device by approximately two to four volts.

In order to erase the EEPROM cell, a relatively high positive potential (e.g., +5.0 volts) is applied to the source region. The control gate has applied thereto a negative voltage of −8.5 volts, and the drain region is allowed to float. A strong electric field develops between the floating gate and the source region, and negative charges are extracted from the floating gate to the source region by way of Fowler-Norheim tunneling.

In order to determine whether the EEPROM cell has been programmed or not, the magnitude of the read current is measured. Typically, in the read mode of operation, the source region is held at a ground potential and the control gate is held at a potential of about +4.2 volts. The drain region is held at a potential between 1 to 2 volts. Under these conditions, an unprogrammed or erased cell (storing a logic "1") will conduct a predetermined amount of current. On the other hand, the programmed cell (storing a logic "0") will have considerably less current flowing.

In addition, in conjunction with the performing of program, erase, and read operations in the array of Flash EEPROM memory cells there is required the task of trimming (program) and verify the threshold of a reference cell from an erased state up to a desired level for the read, erase verify, and program verify modes of operation. This procedure of reference cell trimming and verify are very difficult and time-consuming and are performed by production engineers during the fabrication process of the Flash memory devices. Initially, the reference cell is erased and then it is trimmed and verified. First, high voltage pulses with a controlled pulse width and voltage amplitude are applied to the control gate and the drain of the reference cell above the potential applied to the source. These pulses are applied so as to add charges onto the floating gate of the reference cell. Then, a test mode of operation is performed to verify the threshold voltage $V_t$ of the reference cell. In this test mode of operation, a fixed gate voltage is applied to the reference cell and a small drain voltage of +0.5 volts is applied to the drain thereof. Under this bias condition, the reference cell will conduct a certain amount of current. This is very similar to the conventional read operation.

If the reference cell has reached the desired program threshold under this bias condition, then a fixed amount of drain current will be known to be flowing which can be determined by laboratory experimentation. In other words, when the voltage at the drain is fixed, for example, at +0.5 volts and an overdrive voltage defined by $(V_{gs}-V_t)$ applied to the control gate is set to 1 volt, a certain desired drain current should be obtained such as 4.5 $\mu$A. However, taken into consideration of the variations caused by the test fixture and changes in the power supply voltage, the actual drain current may be 4.5 $\mu$A±1 $\mu$A or between the range of 3.5 $\mu$A to 5.5 $\mu$A.

If the measured current is higher than 5.5 $\mu$A, then another program pulse will be applied so as to raise the threshold voltage $V_t$ in order to reduce the overdrive voltage. On the other hand, if the measured current is less than 3.5 $\mu$A, then this means that the reference cell has been over-programmed (e.g., the threshold voltage $V_t$ is too high). Thus, the reference cell must be erased in order to lower its threshold voltage $V_t$. This cycle of program pulse, program verify, program pulse is repeated over and over until the reference cell has successfully been programmed to the desired threshold. Presently, all of the threshold voltages of the reference cells are being trimmed and verified externally with a test fixture. This requires a large amount of time and increases labor costs.

Moreover, it is very difficult to precisely measure the current to be within the desired range during the production process. Further, it is extremely hard to be able to control precisely the amplitude of the program pulse as well as its pulse width. Nevertheless, in order to simplify the production process, the inventor of the present invention has developed a way of implementing the same function on the same semiconductor integrated circuit containing the memory device. This is accomplished by the provision of a reference cell trimming verify circuit for performing a program verify operation on a reference cell so as to reduce overall testing time during a production process, assuming that each on-chip programming pulse can increment the threshold voltage of the reference cell by a finite step. Thus, in order to program a reference cell there will be required many programming pulses. The reference cell trimming verify circuit of the present invention provides the same degree of accuracy as previously obtained by the production engineers.

SUMMARY OF THE INVENTION

Accordingly, it is a general object of the present invention to provide a reference cell trimming verify circuit and method for use in an array of Flash EEPROM memory cells for performing a program verify operation on a reference cell which has been traditionally unavailable.

It is an object of the present invention to provide a reference cell trimming verify circuit and method for use in an array of Flash EEPROM memory cells for performing a program verify operation on a reference cell so as to reduce overall testing time during a production process.

It is another object of the present invention to provide a reference cell trimming verify circuit and method for use in an array of Flash EEPROM memory cells for performing a program verify operation on a reference cell which is formed on the same semiconductor integrated circuit containing the memory device.

It is still another object of the present invention to provide a reference cell trimming verify circuit and method for use in an array of Flash EEPROM memory cells for performing a program verify operation on a reference cell which includes a reference current branch for generating a reference current, a drain current branch for generating a drain current, and a comparator for comparing the drain current and the reference current in order to determine when the desired threshold voltage of the reference cell has been reached.

In a preferred embodiment of the present invention, there is provided a reference cell trimming verify circuit for use in an array of Flash EEPROM memory cells for performing a program verify operation on a reference cell. The trimming verify circuit includes a reference current branch for generating a reference current corresponding to a particular overdrive threshold voltage of the reference cell to be programmed. A drain current branch is coupled to the reference cell for generating a drain current at a fixed gate voltage applied to its control gate and at a predetermined drain voltage applied to its drain when the drain current is at its desired level. A high gain amplifier is used to compare a sensed voltage corresponding to the drain current and a reference voltage corresponding to the reference current and generates an output signal which is at a low logic level when the sensed voltage is less than the reference voltage and which is at a high logic level when the sensed voltage is greater than the reference voltage. A program pulse is applied to the reference cell each time the comparator generates the low logic level and terminates the program pulse when the comparator generates the high logic level.

BRIEF DESCRIPTION OF THE DRAWING

These and other objects and advantages of the present invention will become more fully apparent from the following detailed description when read in conjunction with the accompanying drawing in which there is shown a schematic circuit diagram of the reference cell trimming verify circuit for carrying out the program verify operation of the instant invention.

DESCRIPTION OF THE PREFERRED EMBODIMENT

Referring now in detail to the drawing of the particular illustration, there is shown a schematic circuit diagram of a reference cell trimming verify circuit 10 for use in an array of Flash EEPROM memory cells for performing a program verify operation on a reference cell so as to reduce the overall testing time during the production process, constructed in accordance with the principles of the present invention. The trimming verify circuit 10 of the present invention serves to determine precisely the threshold voltage $V_t$ of a reference cell. This is accomplished by setting up a reference current source corresponding to a desired overdrive voltage ($V_{gs}-V_t$) a reference cell to be programmed, comparing a sensed voltage corresponding to a drain current in the reference cell with a reference voltage corresponding to the reference current, and terminating the program pulse to the reference cell when the sensed voltage becomes greater than the reference voltage. At this moment, the threshold voltage $V_t$ of the reference cell will be known. The reference cell trimming verify circuit is formed on the same semiconductor integrated circuit containing the memory device.

The reference cell trimming verify circuit 10 is depicted for use with a reference cell 12 to be trimmed or programmed, which is formed by a floating gate reference cell transistor Q1 having a drain, source and gate. The reference cell transistor Q1 has its control gate connected to a node A for receiving a fixed gate voltage VG, its drain connected to a node B for receiving a fixed drain voltage VD when the drain current is at the desired level, and its source connected to a lower or ground potential VSS. The trimming verify circuit 10 includes a verify voltage selection circuit 12, a reference current branch 14, a drain current branch 16, and a comparator 18.

The verify voltage selection circuit 12 includes a pass gate transistor Q2, a resistor-divider network formed by resistors R1–R3, and a plurality of select transistors Q3–Q5. The pass gate transistor Q2 has its drain connected to a first upper power supply potential VDD1, which is approximately +6.0 volts, its source connected to one end of the resistor R1 at a node C, and its gate connected to receive an input signal VERIFY. The resistor R2 has its one end connected to the other end of the resistor R1 at a node D. The resistor R3 has its one end connected to the other end of the resistor R2 at a node E. The other end of the resistor R3 is connected to the lower power supply potential VSS.

The first select transistor Q3 has its drain connected to the source of the pass gate transistor Q2 at the node C and its source connected to the control gate of the reference cell transistor Q1 at the node A. The gate of the select transistor Q3 is connected to receive a select signal VP1. Similarly, the second select transistor Q4 has its drain connected to the other end of the resistor R1 at the node D and its source connected to the control gate of the reference cell transistor Q1 at the node A. The gate of the select transistor Q4 is connected to receive a select signal VP2. Further, the third select transistor Q5 has its drain connected to the other end of the resistor R2 at the node E and its source connected to the control gate of the reference cell transistor Q1 at the node A. The gate of the select transistor Q5 is connected to receive a select signal VP3. Only one of the select signals VP1, VP2 or VP3 will be activated at a time so as to select the appropriate voltage level to be applied to the control gate of the reference cell transistor Q1 during the respective program-verify, read, or read-verify modes of operation.

The reference current branch 14 includes a pass gate transistor Q6 and a resistor-divider network formed by resistors R4, R5. The pass gate transistor Q6 has its drain connected to a second upper power supply potential VDD2, its source connected to one end of the resistor R4, and its gate connected also to receive the input signal VERIFY. The resistor R5 has its one end connected to the other end of the resistor R4 at a node F and its other end connected to the lower power supply potential VSS. The reference current branch 14 is used to set up a reference current IREF which is equal to VDD2/(R4+R5). This reference current level is selected to correspond to a desired overdrive voltage ($V_{gs}-V_t$) of the reference cell transistor Q1 to be trimmed. For example, the reference current level is set to be equal to 4.5 $\mu$A corresponding to the overdrive voltage ($V_{gs}-V_t$)=+1.0 volts. If $V_{gs}$=+5.0V, then $V_t$=+4.0V, and if $V_{gs}$=+4.0V, then $V_t$=+3.0V. This reference current will cause a reference voltage V(IN1) to be developed across the resistor R5 (at the node F).

The drain current branch 16 includes a pass gate transistor Q7, and a resistor-divider network formed by resistors R6, R7 and the reference cell transistor Q1. The pass gate transistor Q7 has its drain corrected also to the second upper power supply potential VDD2, its source connected to one end of the resistor R6, and its gate connected also to receive the input signal VERIFY. The reference cell transistor Q1 represents a variable resistance and its value is dependent upon its threshold voltage $V_t$. One end of the resistor R7 is connected to the other end of the resistor R6 at a node G, and the other end of the resistor R7 is connected to the ground potential via the drain/source electrodes of the reference cell transistor Q1. When the input signal VERIFY is activated during the verify mode of operation, a certain amount of drain current ID will flow through the drain current branch 16. This drain current ID will cause a sensed voltage V(IN2) to be developed across the resistor R7 and the drain/source electrodes of the transistor Q1 (at the node G). This sensed voltage V(IN2) will be varied and is dependent upon the equivalent resistance of the transistor Q1.

The comparator 18 is formed by a high gain amplifier having an inverting input connected to receive the reference voltage V(IN1) at the node F and a non-inverting input connected to receive the sensed voltage V(IN2) at the node G. The comparator is used to amplify the voltage difference between the sensed voltage and the reference voltage and will generate an output logic signal VDONE on a lead line 20.

In operation, when the threshold voltage $V_t$ of the reference cell 12 is at the desired level, the drain current ID must be equal to the reference current IREF of 4.5 μA, which was previously set up. Therefore, the value of the resistance for the resistor R7 is selected so that when the drain current ID=4.5 μA there is a voltage of +0.5 volts at the drain or the node B of the reference cell transistor Q1. At this condition, the threshold voltage $V_t$ of the reference cell will be at the desired level. Since the values of the resistors R6 and R4 are made to be equal, then the sensed voltage V(IN2) at the node G should be equal to the reference voltage V(IN1) at the node F. On the other hand, if the threshold voltage $V_t$ of the reference cell is slightly higher or lower than the desired level, then the sensed voltage V(IN2) will be slightly different from the reference voltage V(IN1).

Assuming for the case where the reference cell 12 is in the erased state ($V_{te}$=1 volt) and that it is desired to trim the reference cell up to have a threshold voltage $V_{tp}$ equal to +5.0 volts corresponding to a reference current of 4.5 μA. Accordingly, the select signal VP1 will then be activated so as to allow the first power supply potential VDD1 to reach the control gate of the reference cell transistor Q1. When the input signal VERIFY goes high, the reference current branch 14 and the drain current branch 16 will both be activated. Since the reference cell 12 is in the erase state, its equivalent resistance will be low so as to cause the drain current to be higher than the reference current IREF. As a result, the sensed voltage V(IN2) will be lower than the reference voltage V(IN1). Thus, the output signal VDONE of the comparator 18 on the line 20 will be at the low logic level.

The output signal being at the low logic level will be used to activate a state machine (not shown) to cause a program pulse to be generated and applied to the reference cell in order to raise its threshold voltage level. It should be understood that the input signal VERIFY will be turned off during the application of the program pulse. Then, the input signal VERIFY will go high again, and the voltages V(IN2) and V(IN1) will be compared again.

It should be understood by those skilled in the art that each program pulse is assumed to be able to increment the threshold voltage of the reference cell being programmed by a small finite step, such as 0.005 volts per program pulse. This small finite step is achieved by controlling the voltage levels at the gate and drain of the reference cell and by varying the width of the program pulse. In this manner, by the application of many program pulses, the threshold level of the reference cell to be programmed can be increased in small incremental steps from its initial erased threshold $V_{te}$ up to the desired or program threshold level $V_{tp}$.

Thus, this cycle of applying a program pulse and program verify will be repeated over and over again until the drain current ID is slightly lower than the reference current IREF. At this point, the sensed voltage V(IN2) will be slightly higher than the reference voltage V(IN1). This will cause the output signal on the lead line 20 of the comparator 18 to go to a high logic level. This high logic signal will cause the state machine to terminate the application of further program pulses. It should be noted that the desired program threshold level can be changed by activating alternatively the select signal VP2 or VP3. As a result, the fixed gate voltage VG at the node A of the reference cell transistor will be changed and correspondingly the target threshold voltage.

From the foregoing detailed description, it can thus be seen that the present invention provides a reference cell trimming verify circuit for performing a program verify operation on a reference cell transistor in an array of Flash EEPROM memory cells. The reference cell trimming verify circuit includes a verify voltage selection circuit, a reference current branch, a drain current branch, and a comparator. The comparator is used to compare a sensed voltage corresponding to a drain current and a reference voltage corresponding to a reference current. A program pulse is applied to the reference cell each time the sensed voltage is lower than the reference voltage. When the sensed voltage is higher than the reference voltage, this indicates that the desired threshold has been reached.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A reference cell trimming verify circuit for performing a program verify operation on a reference cell transistor in an array of Flash EEPROM memory cells, said trimming circuit comprising:

reference current branch means for generating a reference current corresponding to a predetermined overdrive voltage of the reference cell transistor to be programmed;

drain current branch means coupled to the reference cell transistor to be programmed for generating a drain current at a fixed gate voltage applied to its control gate and at a predetermined drain voltage applied to its drain when the drain current is at a desired level;

comparing means for comparing a sensed voltage corresponding to said drain current and a reference voltage corresponding to said reference current and for generating an output signal which is at a low logic level when said sensed voltage is less than said reference voltage and which is at a high logic level when said sensed voltage is higher than said reference voltage;

means for applying a program pulse to said reference transistor each time said comparing means generates the low logic level and terminating said program pulse when said comparing means generates the high logic level; and said reference current branch means including a first pass gate transistor and a resistor-divider network formed of a first resistor and a second resistor, the drain/source electrodes of said first pass rate transistor, the first resistor, and the second resistor being connected in series between a first upper power supply potential and a lower power supply potential so as to generate said reference current flowing therethrough, the junction of said first and second resistors generating said reference voltage.

2. A reference cell trimming verify circuit as claimed in claim 1, further comprising verify voltage selection means for generating different fixed gate voltages which are applied to the control gates of the reference transistor for program verifying the reference transistor to correspondingly different threshold voltage level.

3. A reference cell trimming verify circuit as claimed in claim 2, wherein said verify voltage selection means includes a pass gate transistor, a resistor-divider network formed of a plurality of resistors, and a plurality of select transistors.

4. A reference cell trimming verify circuit as claimed in claim 1, wherein said drain current branch means includes a second pass gate transistor and a resistor-divider network formed by third and fourth resistors and said reference transistor, the drain/source electrodes of said second pass gate transistor, the third and fourth resistors, and the drain/source electrodes of said reference transistor being connected in series between the first upper power supply potential and the lower power supply potential so as to generate said drain current flowing therethrough, the junction of said third and fourth resistors generating said sensed voltage.

5. A reference cell trimming verify circuit as claimed in claim 4, wherein said comparing means includes a high gain amplifier having its inverting input connected to receive said reference voltage and its non-inverting input connected to receive said sensed voltage and an output for providing said output signal.

6. A reference cell trimming verify method for performing a program verify operation on a reference cell transistor in an array of Flash EEPROM memory cells, said trimming method comprising the steps of:

generating a reference current corresponding to a predetermined overdrive voltage of the reference cell transistor to be programmed through a reference current branch;

generating a drain current through a drain current branch coupled to the reference cell transistor to be programmed at a fixed gate voltage applied to its control gate and at a predetermined drain voltage applied to its drain when the drain current is at a desired level;

comparing a sensed voltage corresponding to said drain current and a reference voltage corresponding to said reference;

generating an output signal which is at a low logic level when said sensed voltage is less than said reference voltage and which is at a high logic level when said sensed voltage is higher than said reference voltage;

applying a program pulse to said reference transistor each time said comparing step generates the low logic level and terminating said program pulse when said comparing step generates the high logic level;

providing said reference current branch to include a first pass gate transistor and a resistor-divider network formed of a first resistor and a second resistor;

connecting the drain/source electrodes of said first pass gate transistor, the first resistor, and the second resistor in series between a first upper power supply potential and a lower power supply potential so as to generate said reference current flowing therethrough; and generating said reference voltage at the junction of said first and second resistors.

7. A reference cell trimming verify method as claimed in claim 6, further comprising the step of generating different fixed gate voltages with a verify voltage selection circuit, the fixed gate voltages being applied to the control gates of the reference transistor for program verifying it to correspondingly different threshold voltage level.

8. A reference cell trimming verify method as claimed in claim 7, wherein said verify voltage selection circuit includes a pass gate transistor, a resistor-divider network formed of a plurality of resistors, and a plurality of select transistors.

9. A reference cell trimming verify method as claimed in claim 6, wherein said drain current branch includes a second pass gate transistor and a resistor-divider network formed by third and fourth resistors and said reference transistor, the drain/source electrodes of said second pass gate transistor, the third and fourth resistors, and the drain/source electrodes of said reference transistor being connected in series between the first upper power supply potential and the lower power supply potential so as to generate said drain current flowing therethrough, the junction of said third and fourth resistors generating said sensed voltage.

10. A reference cell trimming verify method as claimed in claim 9, wherein said comparing step includes the steps of receiving said reference voltage on an inverting input of a high gain amplifier, receiving said sensed voltage on a non-inverting input of the high gain amplifier, and generating said output signal on an output of the high gain amplifier.

* * * * *